US012653065B2

(12) United States Patent
Cheah et al.

(10) Patent No.: US 12,653,065 B2
(45) Date of Patent: Jun. 9, 2026

(54) SEMICONDUCTOR PACKAGE WITH STACKED MEMORY DEVICES

(71) Applicant: Intel Corporation, Santa Clara, CA (US)

(72) Inventors: Bok Eng Cheah, Gelugor Pulau Penang (MY); Chia Chuan Wu, Butterworth (MY); Jackson Chung Peng Kong, Tanjung Tokong Pulau Penang (MY); Kooi Chi Ooi, Gelugor Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 17/535,606

(22) Filed: Nov. 25, 2021

(65) Prior Publication Data

US 2023/0163101 A1 May 25, 2023

(51) Int. Cl.
*H10W 90/00* (2026.01)
*G11C 5/06* (2006.01)
(Continued)

(52) U.S. Cl.
CPC ............... *H10W 90/00* (2026.01); *G11C 5/06* (2013.01); *H10B 12/02* (2023.02); *H10B 12/30* (2023.02);
(Continued)

(58) Field of Classification Search
CPC ........... H01L 25/0657; H01L 21/76802; H01L 23/5384; H01L 2225/06513; H01L 2225/06517; H01L 2225/06524; H01L 2225/06541; H01L 25/0652; H01L 25/18; H01L 23/13; H01L 23/147; H01L 23/49816; H01L 23/49827; H01L 23/5383;
(Continued)

(56) References Cited

U.S. PATENT DOCUMENTS

2011/0186998 A1* 8/2011 Wu ...................... H10W 70/095
257/738
2021/0020543 A1* 1/2021 Lee ...................... H10W 20/023

OTHER PUBLICATIONS

RF Wireless World; "Home of RF and Wireless Vendors and Resources"; https://www.rfwireless-world.com/Terminology/Difference-between-HBM1-HBM2-HBM3.html; RF Wireless World 2012, RF & Wireless Vendors and Resources; retrieved on Nov. 19, 2021, 5 pages.

* cited by examiner

*Primary Examiner* — Fernando L Toledo
*Assistant Examiner* — Jorge Andres Lopez
(74) *Attorney, Agent, or Firm* — Viering, Jentschura & Partner mbB

(57) ABSTRACT

The present disclosure is directed to semiconductor packages, and methods for making them, which includes a package substrate, an interposer with a redistribution layer positioned on the interposer. A recess may be formed in a bottom surface in the interposer and a plurality of through silicon vias may be formed in the interposer, including the recess, that are coupled to a bottom surface of the redistribution layer. A recess device may be positioned in the recess and coupled to the redistribution layer. A top-side device may be positioned on and coupled to a top surface of the redistribution layer, and a footprint of the top-side device may be aligned to overlap the recess device. In an aspect, the recess device and the top-side device may be stacked memory devices, e.g., DRAMs, SRAMs, and/or other memory devices.

17 Claims, 11 Drawing Sheets

(51) Int. Cl.

| | | |
|---|---|---|
| *H10B 12/00* | (2023.01) | |
| *H10W 20/00* | (2026.01) | |
| *H10W 70/60* | (2026.01) | |
| *H10W 70/63* | (2026.01) | |

(52) U.S. Cl.
CPC ........ *H10W 20/081* (2026.01); *H10W 70/611* (2026.01); *H10W 70/635* (2026.01)

(58) Field of Classification Search
CPC ......... H01L 23/5385; G11C 5/06; G11C 5/04; H10B 12/02; H10B 12/30
See application file for complete search history.

10

30
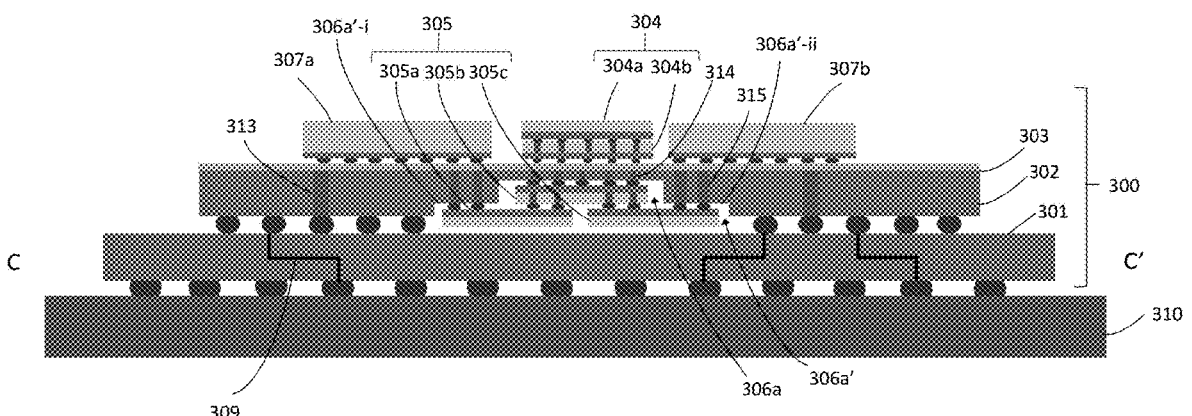
FIG. 3

30

400a

413

418

401

419

400

420

401

421

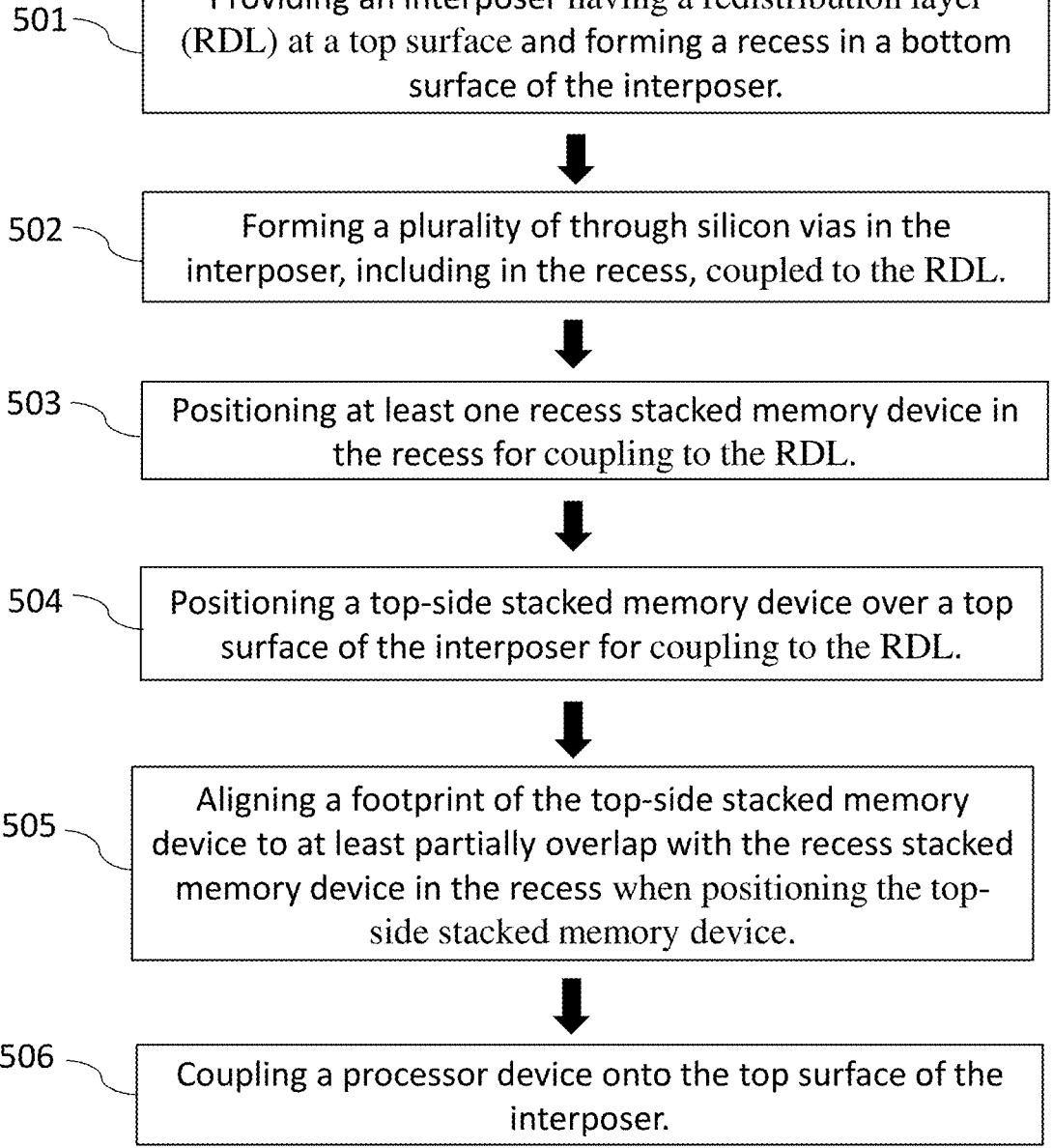

501 — Providing an interposer having a redistribution layer (RDL) at a top surface and forming a recess in a bottom surface of the interposer.

502 — Forming a plurality of through silicon vias in the interposer, including in the recess, coupled to the RDL.

503 — Positioning at least one recess stacked memory device in the recess for coupling to the RDL.

504 — Positioning a top-side stacked memory device over a top surface of the interposer for coupling to the RDL.

505 — Aligning a footprint of the top-side stacked memory device to at least partially overlap with the recess stacked memory device in the recess when positioning the top-side stacked memory device.

506 — Coupling a processor device onto the top surface of the interposer.

CAMERA

ANTENNA

SRAM    SRAM

COMMUNICATION
CHIP
602

COMMUNICATION
CHIP

PACKAGE
600

CHIPSET

AMP    DRAM

ROM

TOUCHSCREEN
CONTROLLER

GPS    COMPASS

601
MOTHERBOARD

SPEAKER    BATTERY

TOUCHSCREEN DISPLAY

SEMICONDUCTOR PACKAGE WITH STACKED MEMORY DEVICES

BACKGROUND

To enable greater miniaturization, present packaging technology uses die stacking to incorporate two or more chiplets and/or memory devices into a vertical assembly. With stacked designs, the challenges of increasing device form-factor may be partially addressed, but may conversely cause increases in interconnect distances between devices due to their routing requirements and/or planar geometries from die stacking hierarchies. It is also known that stacked placements and wire sizing may cause signal delays and impact the performance of circuits.

Current approaches for reducing signal latency include the mounting of dynamic random access memory (DRAM) packages near the central processing unit (CPU) or graphic processing unit (GPU) device to reduce the interconnect trace length. However, the placement of DRAM packages on the top side of a system on a chip (SOC) package will occupy valuable package real-estate due to the side-by-side placement of the DRAM packages with the SOC die(s) and the required footprint for the DRAM signal breakout. The challenges of increased form-factor have resulted in the greater use of stacked DRAM memory devices with each new design generation (i.e., from 4-stacked hierarchy (HBM1) up to 16-stacked hierarchy (HBM3)) to achieve improved device bandwidth density with a trade-off of increased z-height.

The use of stacked device configurations may also result in signal integrity impairments due to electrical coupling noises (e.g., far-end crosstalk (FEXT)) caused by the adjacent placement of transmission lines. With every advancement of HBM technology (e.g., Gen1 (128 GB/s) to Gen3 (819 GB/s)), the impact of FEXT has become increasingly significant due to the sextupled data rate per bit (i.e., from 1 Gbps to 6.4 Gbps), and increased interconnects transitions and/or channel impedance discontinuities due to higher stacked DRAM hierarchy.

While the present use of 2.5D and/or 3D integrated circuit packaging may reduce signal latency between a CPU/GPU and their associated memory devices, such 2.5D and 3D architecture approaches may increase power loop inductance, have higher resistance from through silicon via interconnects, and result in increased package z-height. Moreover, the addition of DRAM memory devices for performance scaling may result in ultra-thin silicon wafer handling and assembly process challenges, e.g., warpage control of DRAM silicon wafers with thicknesses of approximately 30 μm or below. There is a need for novel stacked die configurations to address these concerns by providing improved signal and power integrity for performance scaling and greater device miniaturization.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 3 shows a cross-sectional view of an electronic assembly having a semiconductor package with stacked memory devices along a C-C' line according to yet another aspect of the present disclosure;

FIG. 5 shows a simplified flow diagram for an exemplary method for making semiconductor packages with stacked memory devices according to an aspect of the present disclosure.

DETAILED DESCRIPTION

Figure 1:
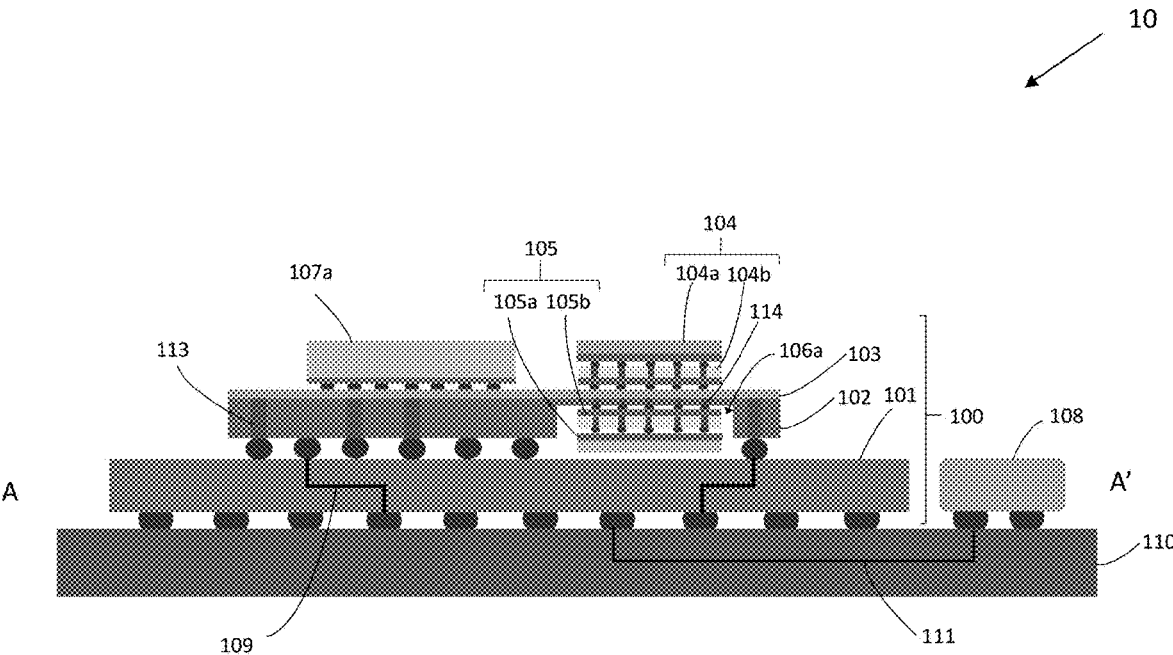
FIG. 1 shows a cross-sectional view of an electronic assembly having a semiconductor package with stacked memory devices along an A-A' line according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to semiconductor packages that may have a package substrate, an interposer with a top surface and a bottom surface positioned over and coupled to a top surface of the package substrate, and a redistribution layer positioned on the top surface of the interposer. In an aspect, a first recess may be formed in the bottom surface in the interposer and a plurality of through silicon vias may be formed in the interposer, including the recess, that are coupled to the redistribution layer.

In another aspect, a first recess device may be positioned in the first recess and coupled to the redistribution layer. Such positioning of a device in a downward facing recess may be called an "opposum" configuration. In another aspect, a first top-side device may be positioned on and coupled to a top surface of the redistribution layer, and a footprint of the first top-side device may be aligned to fully or at least partially overlap the first recess device. In an aspect, the first recess device and the first top-side device may be stacked memory devices (e.g., DRAMs, SRAMs, and/or other memory devices). In a further aspect, a first processor device (e.g., CPU, GPU, platform controller hub chipset, neural network accelerator, and/or other processor devices) may be positioned over and coupled to the redistribution layer and a footprint of the first processor device may be aligned to overlap the first recess device.

The technical advantages of the present disclosure may include, but not limited to, providing improved signal integrity and power delivery between a processor/system-on-chip and memory devices, through reduced interconnect length and improved channel impedance matching (i.e., less distortion), and reduced power consumption. In particular, shared interconnect paths may be created from one or more processor devices to a plurality of stacked memory devices through a silicon interposer using a T-branch topology (i.e., separated to memory devices above and below the interposer) instead of an extended daisy chain topology (i.e., through a single vertically stacked column of memory devices) for reduced signal distortion.

Another technical advantage of the present disclosure may include providing improved platform miniaturization through reducing the z-height of a semiconductor package, i.e., positioning stacked memory devices within interposer recesses rather than on the top-side, as conventional 2.5D architecture positions stacked memory devices on the surface of a substrate or silicon interposer.

A further technical advantage of the present disclosure may include providing improved product assembly yields and/or increased throughput by reducing the need for DRAM memory devices with TSV interconnects. A reduction in the use of DRAM memory devices with TSV interconnects, for example, from 3 to 2 may be achieved by placing a stacked memory device on the top-side of an interposer and another stacked memory device in a recess in the interposer recess as a design configuration.

To more readily understand and put into practical effect the present semiconductor package, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, according to an aspect of the present disclosure, a cross-sectional view of an electronic assembly 10 having a semiconductor package 100 with a first top-side stacked memory device 104 (i.e., memory devices 104*a* and 104*b*) and a first recess stacked memory device 105 (i.e., memory devices 105*a* and 105*b*) positioned in a first recess 106*a* in an interposer 102 along an A-A' line is shown. In this aspect, the top-side stacked memory device 104 may be overlapping and fully aligned with the recess stacked memory device 105, and the memory devices 104*b* and 105*b* may be stackable DRAM or SRAM memory devices with TSV interconnects to connect with stackable DRAM or SRAM memory devices 104*a* and 105*a*, respectively.

In an aspect, according to the present disclosure, a top-side stack memory device may be separated from a recess stacked memory device by a metal redistribution layer, which is coupled to both of them. In all such present layouts, one of the stacked memory devices may be configured to facilitate a first signal data group (e.g., a rank 0 signal data group), while the other separated stacked memory device may be configured to facilitate a second signal data group (e.g., a rank 1 signal data group) in a multi-rank DRAM or SRAM configuration.

Further, in this aspect, the semiconductor package 100 may further include a package substrate 101 with interconnect lines 109, the interposer 102 with a redistribution layer 103, and a first processor device 107*a* (e.g., a central processing unit (CPU), a graphic processing unit (GPU), a neural network accelerator or other processor devices) coupled to the redistribution layer (RDL) 103. In an aspect, the interposer 102 may be a silicon interposer, an organic interposer, or a glass interposer. In another aspect, the RDL 103 may include a plurality of metal routing layers and/or vertical vias (not shown) configured to facilitate electrical connections, current return path and/or power delivery, with the metal routing layers and/or vertical vias being isolated by a dielectric layer (not shown) disposed therebetween.

In addition, in this aspect, a plurality of TSVs may include interposer TSVs 113, which may couple the package substrate 101 to the RDL 103, and recess TSVs 114, which may couple the recess stacked memory device 105 to the RDL 103. Also, in this aspect, the electronic assembly 10 may have a printed circuit board 110 with one or more trace lines 111 for coupling/connecting, for example, one or more electronic components 108 (e.g., passive components) with the devices in semiconductor package 100. In an aspect, the first processor device 107*a* may be coupled to the electronic component 108, e.g., a voltage regulator, a capacitor, a connector receptacle, or a transceiver mounted on the printed circuit board 110 through the interposer 102, the package substrate 101, and PCB metal trace 111.

This representative cross-section view, as well as for the following layout and cross-section drawings, provides the approximate footprints for the various selected features of the present semiconductor packages and their relative positions in the semiconductor packages, which may be situated on different heights or levels thereof.

Figure 1A:
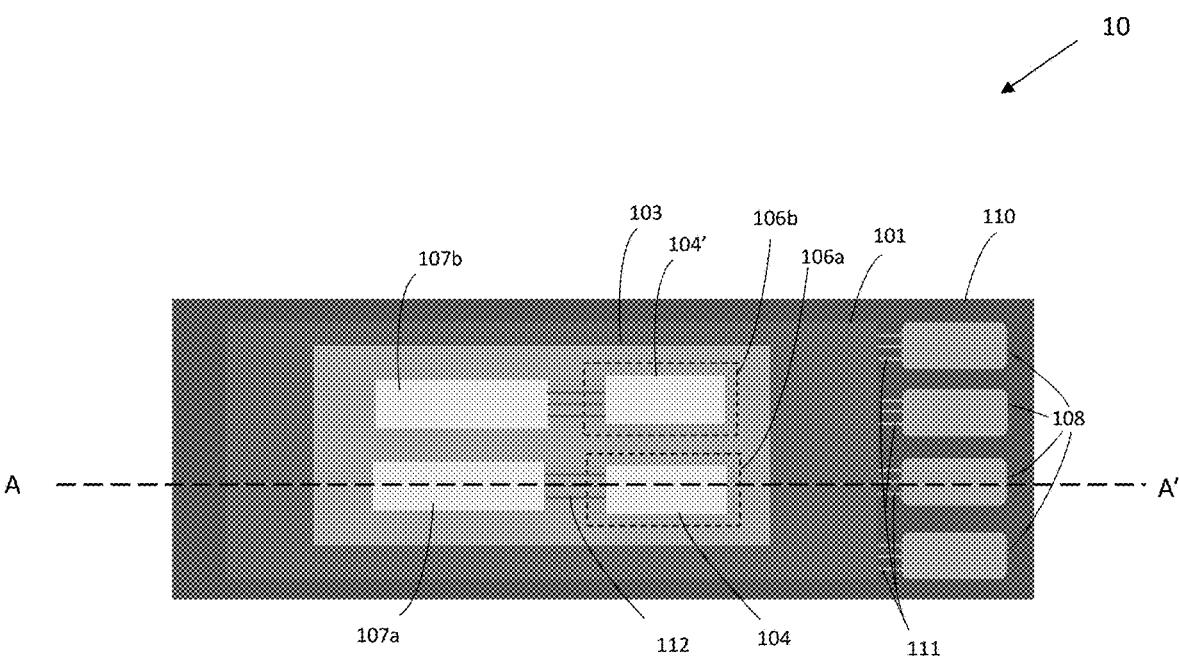
FIG. 1A shows a top view layout of the electronic assembly having the semiconductor package with stacked memory devices, as shown in FIG. 1, according to an aspect of the present disclosure.

In FIG. 1A, according to an aspect of the present disclosure, a top view layout of the electronic assembly 10, as shown in FIG. 1, is presented. For this aspect, the electronic assembly 10 may have the package substrate 101, which includes the interposer 102 (not shown) with the redistribution layer 103, positioned on a top surface of the printed circuit board 110. The first top-side stacked memory device 104*a* and a second top-side stacked memory device 104*c* may be coupled to the redistribution layer 103, as shown in FIG. 1A. The first top-side stacked memory device 104*a* and the second top-side stacked memory device 104*c* may be overlapping with recess stacked memory devices (not shown) that may be positioned in recesses 106*a* and 106*b*, which are shown as dashed lines.

In addition, in this aspect, the first processor device 107*a*, and a second processor device 107*b* may be coupled to the redistribution layer 103, which may allow them to be coupled to the first top-side stacked memory device 104 and the second top-side stacked memory device 104', as shown by a plurality of representational trace lines 112. Also, as shown in FIG. 1A, the printed circuit board 110 may have a plurality of representational trace lines 111 for coupling/connecting, for example, a plurality of electronic components 108 (e.g., passive components and other components) with the devices in semiconductor package 100 (not shown).

Figure 2:
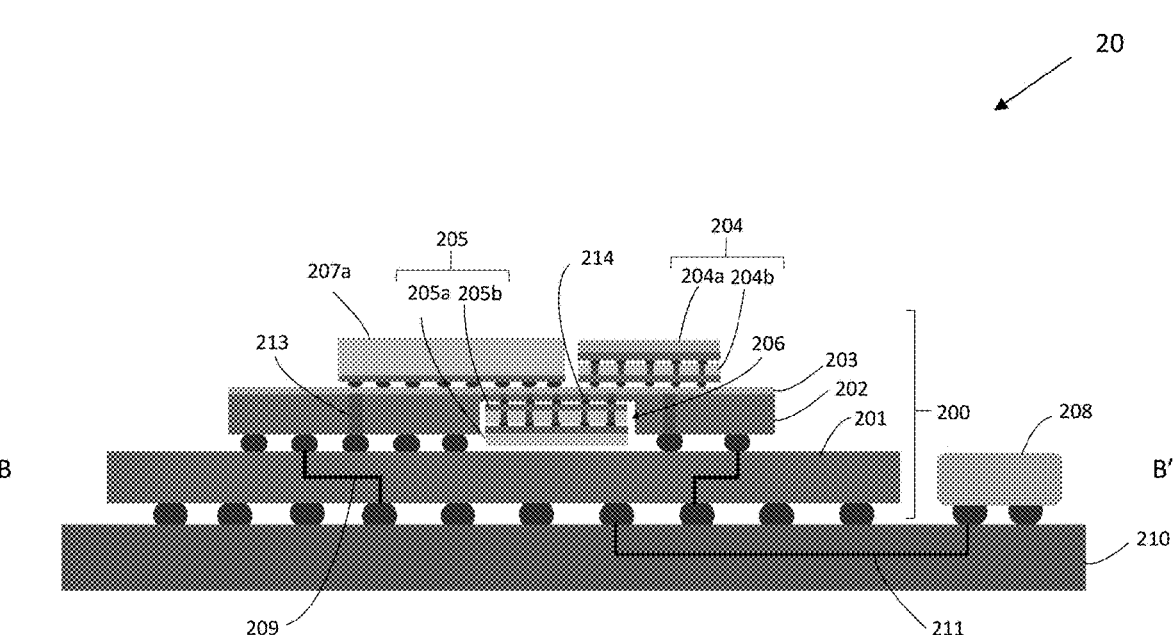
FIG. 2 shows a cross-sectional view of an electronic assembly having a semiconductor package with stacked memory devices along a B-B' line according to another aspect of the present disclosure.

As shown in FIG. 2, according to an aspect of the present disclosure, an electronic assembly 20 having a semiconductor package 200 with a first top-side stacked memory device 204 (i.e., memory devices 204*a* and 204*b*) and a first recess stacked memory device 205 (i.e., memory devices 205*a* and 205*b*) positioned in a recess 206 in an interposer 202 along a B-B' line is shown. In this aspect, the top-side stacked memory device 204 may be at least partially overlapping and aligned with the recess stacked memory device 205, and the memory devices 204*b* and 205*b* may be stackable DRAM or SRAM memory devices with TSV interconnects to connect with stackable DRAM or SRAM memory devices 204*a* and 205*a*, respectively.

Further, in this aspect, the semiconductor package 200 may further include a package substrate 201 with interconnect lines 209, the interposer 202 with a redistribution layer 203, and a first processor device 207*a* (e.g., a central processing unit (CPU), a graphic processing unit (GPU), a neural network accelerator or other processor devices) coupled to the redistribution layer (RDL) 203. In this aspect, the first processor device 207*a* may be at least partially overlapping and aligned with the recess stacked memory device 205 to allow further reduction in signal propagation delay between the first processor device 207*a* and the recess stacked memory device 205. In an aspect, the interposer 202 may be a silicon interposer, an organic interposer, or a glass interposer. In another aspect, the RDL 203 may include a plurality of metal routing layers and/or vertical vias configured to facilitate electrical connections, current return path and/or power delivery, with the metal routing layers and/or vertical vias being isolated by a dielectric layer disposed therebetween.

In addition, in this aspect, a plurality of TSVs may include interposer TSVs 213, which may couple the package substrate 201 to the RDL 203, and recess TSVs 214, which may couple the recess stacked memory device 205 to the RDL 203. Also, in this aspect, the electronic assembly 20 may have a printed circuit board 210 with one or more trace lines 211 for coupling/connecting, for example, one or more electronic components 208 (e.g., passive components and other components) with the devices in semiconductor package 200.

Figure 2A:
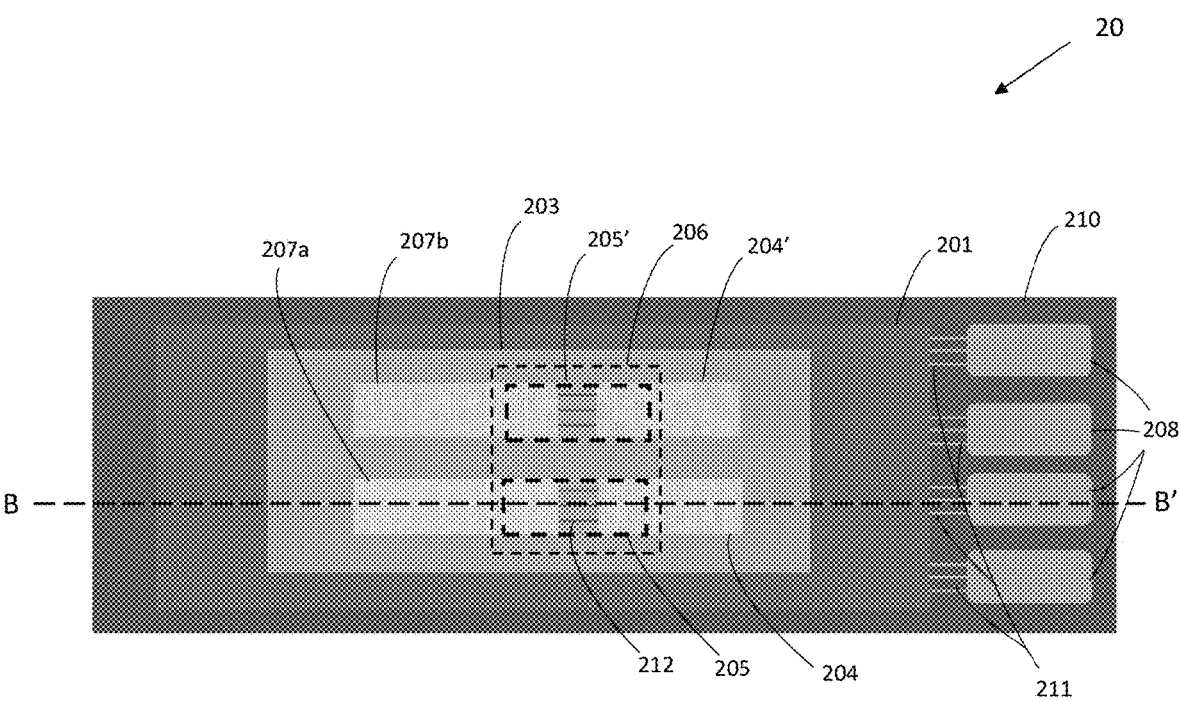
FIG. 2A shows a top view layout of the electronic assembly having the semiconductor package with stacked memory devices, as shown in FIG. 2, according to another aspect of the present disclosure.

In FIG. 2A, according to an aspect of the present disclosure, a top view layout of the electronic assembly 20, as shown in FIG. 2, is presented. For this aspect, the electronic assembly 20 may have the package substrate 201, which includes the interposer 202 (not shown) with the redistribution layer 203, positioned on a top surface of the printed circuit board 210. The first top-side stacked memory device 204 and a second top-side stacked memory device 204' may be coupled to the redistribution layer 203, as shown in FIG. 2A. The first top-side stacked memory device 204 and the second top-side stacked memory device 204' may be overlapping with recess stacked memory devices 205 and 205' (shown as dashed lines), respectively, that may be positioned in a single recess 206 (shown as dashed lines). It is within the scope of the present disclosure to have the recess 206 be configured as two separate recesses, similar to that shown in FIG. 1A.

In addition, in this aspect, the first processor device 207*a*, and a second processor device 207*b* may be coupled to the redistribution layer 203, which may allow them to be coupled to the first top-side stacked memory device 204 and the second top-side stacked memory device 204', respectively, as shown by a plurality of representational trace lines 212. Also, as shown in FIG. 2A, the printed circuit board 210 may have a plurality of representational trace lines 211 for coupling/connecting, for example, a plurality of electronic components 208 (e.g., passive components and other components) with the devices in semiconductor package 200 (not shown).

In FIG. 3, according to an aspect of the present disclosure, a cross-sectional view along a C-C' line of an electronic assembly 30 having a semiconductor package 300 with a first top-side stacked memory device 304 (i.e., first top-side memory devices 304*a* and 304*b*) and a first recess stacked memory device 305 (i.e., recess memory devices 305*a*, 305*b*, and 305*c*). In this aspect, a first upper recess section 306*a* and a first lower recess section 306*a'* may be formed by a first recess step 306*a'*-*i* and a second recess step 306*a'*-*ii* in an interposer 302. Further, in this aspect, an upper recess memory device 305*b* may be positioned in the first upper recess section 306*a*, while a first lower recess memory device 305*a* may be positioned at least partially on the first recess step 306*a'*-*i* and a second lower recess memory devices 305*c* may be positioned at least partially on the second recess step 306*a'*-*ii* of the first lower recess section 306*a'* in the interposer 302. In this aspect, the top-side stacked memory device 304 may be overlapping and fully aligned with the recess memory device 305*b*. In an aspect, the memory devices 304*b* and 305*b* may be stackable DRAM or SRAM memory devices with TSV interconnects, which may have the first top-side memory devices 304*b* coupled to the first top-side memory devices 304*a* and the first upper recess memory device 305*b* coupled to the first and second lower recess memory devices 305*a* and 305*e*.

Also shown in FIG. 3, in an aspect of the present disclosure, the semiconductor package 300 may further include a package substrate 301 with interconnect lines 309, the interposer 302 with a redistribution layer 303, and first and second processor devices 307*a* and 307*b* (e.g., a central processing unit (CPU), a graphic processing unit (GPU), a neural network accelerator and/or other processor devices) coupled to the redistribution layer (RDL) 303. In another aspect, the first top-side stacked memory device 304 (i.e., first top-side memory devices 304*a* and 304*b*) is positioned between the first and second processor devices 307*a* and 307*b*, and the first processor devices 307*a* may be at least partially overlapping and aligned with the first lower recess memory device 305*a* and the second processor devices 307*b* may be at least partially overlapping and aligned with the second lower recess memory device 305*c*.

In an aspect, the interposer 302 may be a silicon interposer, an organic interposer, or a glass interposer. In another aspect, the RDL 303 may include a plurality of metal routing layers and/or vertical vias configured to facilitate electrical connections, current return path and/or power supply delivery, with the metal routing layers and/or vertical vias being isolated by a dielectric layer disposed therebetween.

In addition, in this aspect, a plurality of TSVs may include a first interposer TSVs 313, which may couple the package substrate 301 to the RDL 303, a second upper recess TSVs 314, and a third lower recess TSVs 315, which may couple the first and second lower recess memory devices 305*a* and 305*c*, respectively, to the RDL 303. Also, in an aspect, the electronic assembly 30 may have a printed circuit board 310 with other electronic components (not shown) and a plurality of trace lines (not shown) for coupling/connecting such other electronic components (e.g., passive components and other components) with the devices in semiconductor package 300.

Figure 3A:
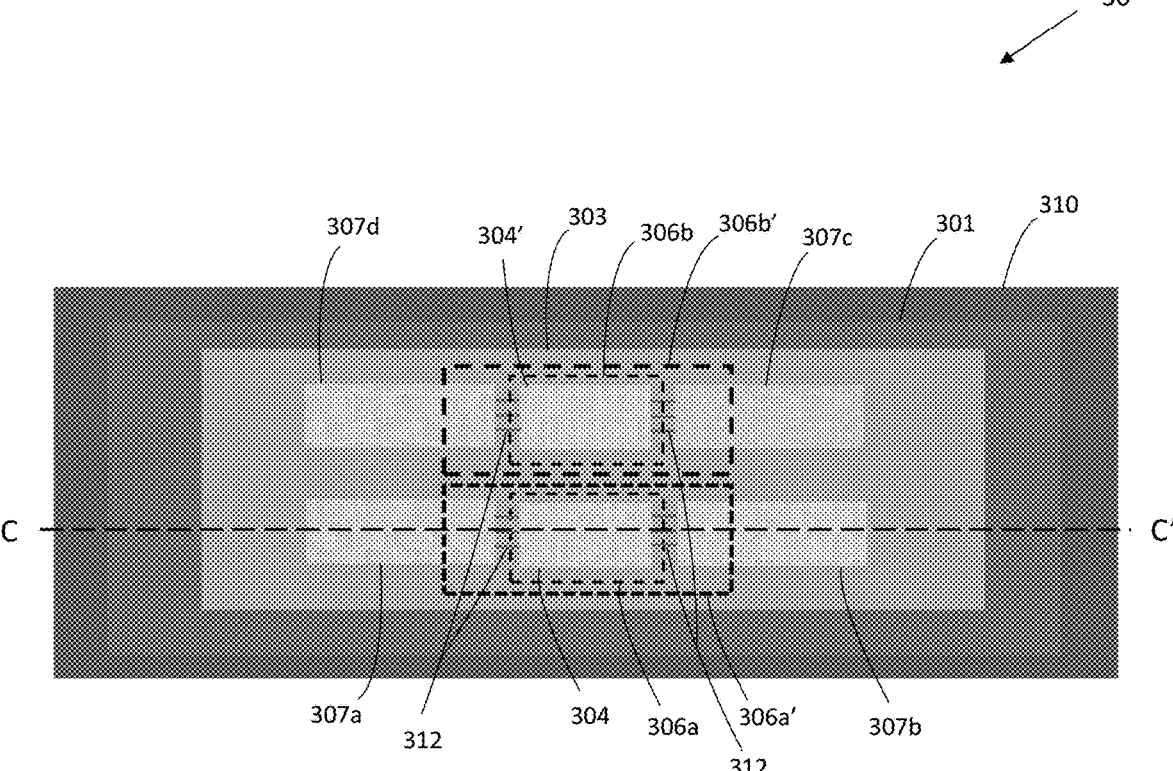
FIG. 3A shows a top view layout of the electronic assembly having the semiconductor package with stacked memory devices, as shown in FIG. 3, according to yet another aspect of the present disclosure.

In FIG. 3A, according to an aspect of the present disclosure, a top view layout of the electronic assembly 30, as shown in FIG. 3, is presented. For this aspect, the electronic assembly 30 may have the package substrate 301, which includes the interposer 302 (not shown) and the redistribution layer 303, positioned on a top surface of the printed circuit board 310. The first top-side stacked memory device 304 and a second top-side stacked memory device 304' may be coupled to the redistribution layer 303, as shown in FIG. 3A. The first top-side stacked memory device 304 may be overlapping and aligned with a first upper recess section 306a (shown as dashed lines) and a first upper recess memory device (not shown) positioned therein, and the second top-side stacked memory device 304' may be overlapping and align with a second upper recess section 306b (shown as dashed lines) and a second upper recess memory device (not shown) positioned therein. It is within the scope of the present disclosure to have the first and second upper recess sections 306a and 306b be configured as a single recess (not shown), similar to that shown in FIG. 2.

In addition, in this aspect, a first processor device 307a and a second processor device 307b may be coupled to the redistribution layer 303, and further coupled by a plurality of representational trace lines 312 with the first top-side stacked memory device 304 that may be positioned therebetween. In addition, a third processor device 307c and a fourth processor device 307d may be coupled to the redistribution layer 303, and further coupled by a plurality of representational trace lines 312 with the second top-side stacked memory device 304' positioned therebetween.

Also, as shown in FIG. 3A, the first processor device 307a and the second processor device 307b may be overlapping and aligned with a first lower recess section 306a' (shown as dashed lines) and a first and second lower recess memory devices (not shown) positioned therein, and the third processor device 307c and the fourth processor device 307d may be overlapping and aligned with a second lower recess section 306b' (shown as dashed lines) and a third and fourth lower recess memory devices (not shown) positioned therein. It is within the scope of the present disclosure to have the first and second lower recess sections 306a' and 306b' be configured as a single recess (not shown).

FIGS. 4A through 4G provide cross-sectional views of a semiconductor package 400 to show an exemplary process flow for making a semiconductor package 400 with stacked memory devices according to aspects of the present disclosure. The semiconductor package 400 is comparable to and has similar structures as the semiconductor package 100 disclosed above.

Figure 4A:
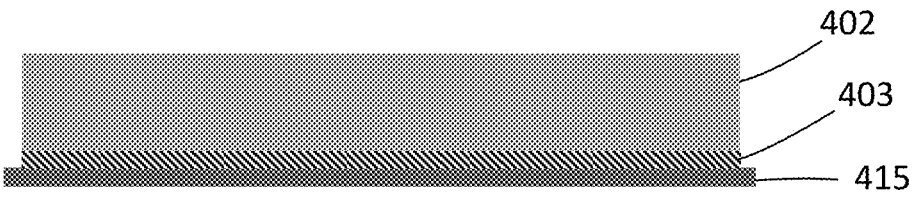
FIGS. 4A through 4G show cross-sectional views directed to an exemplary process flow for making a semiconductor package with stacked memory devices according to aspects of the present disclosure.

In FIG. 4A, according to a further aspect in forming the semiconductor package 400, a silicon interposer 402 with a metal redistribution layer 403 is attached to a first carrier 415 by a conventional lamination or hot press process.

Figure 4B:
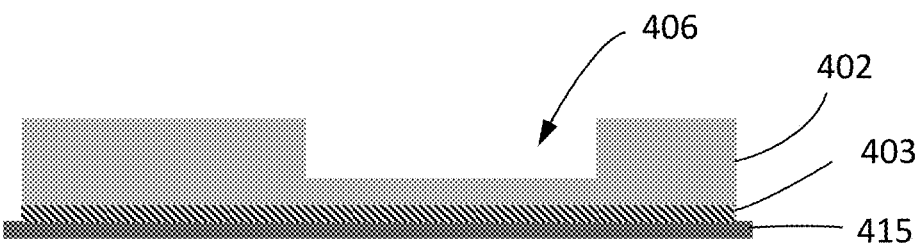

In FIG. 4B, according to a further aspect in forming the semiconductor package 400, a recess 406 in the interposer 402 is formed. An opening for the recess 406 may be formed by a laser or mechanical drilling processing step that removes a portion of the interposer 402. In another aspect, the opening for the recess 406 may be formed by an etching process step, e.g., a plasma etching or a dry reactive ion etching process that removes a portion of the interposer 402. It should be understood that the recess 406 may be formed with an upper and lower recess sections, as shown in FIG. 3, and the following process flow may be modified accordingly.

Figure 4C:
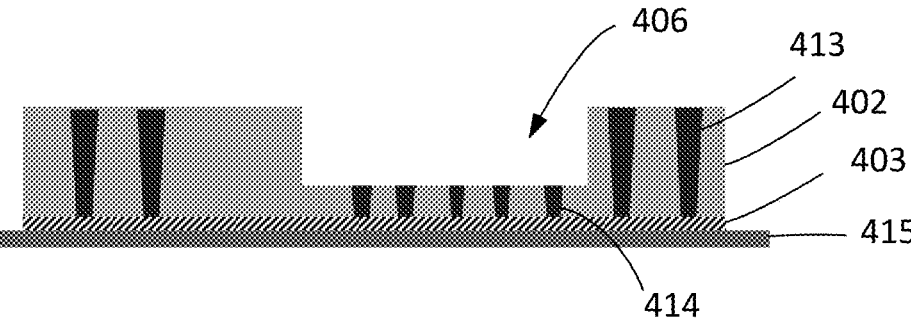

In FIG. 4C, according to a further aspect in forming the semiconductor package 400, a plurality of through silicon vias (TSV) are formed, i.e., interposer TSVs 413 and recess TSVs 414. The openings for the TSVs 413 and 414 may be formed by a laser or mechanical drilling processing step and filled with a conductive material, e.g., copper, using an electroless and/or an electrolytic plating process. In this aspect, the TSVs 413 and 414 are formed attached and electrically coupled to the redistribution layer 403.

Figure 4D:
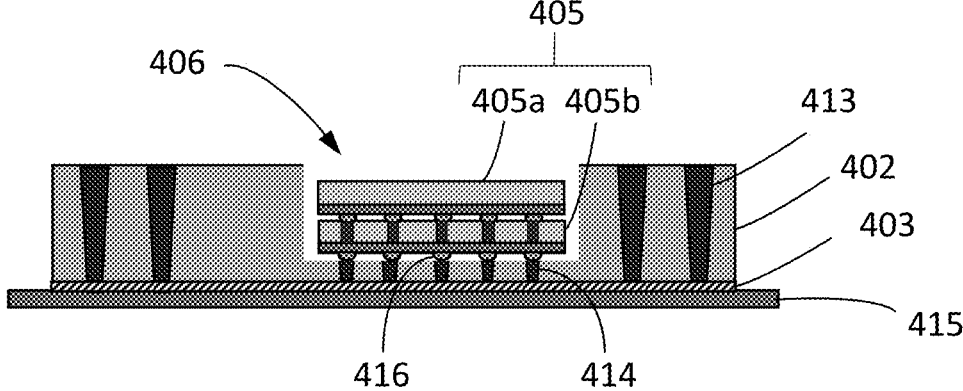

In FIG. 4D, according to a further aspect in forming the semiconductor package 400, a recess stacked memory device 405 (i.e., recess memory devices 405a and 405b) may be positioned in the recess 406 and a plurality of small solder bumps 416 on the recess stacked memory device 405 may be aligned and coupled to the recess TSVs 414 by a conventional thermal compression bonding or solder reflow process step.

Figure 4E:
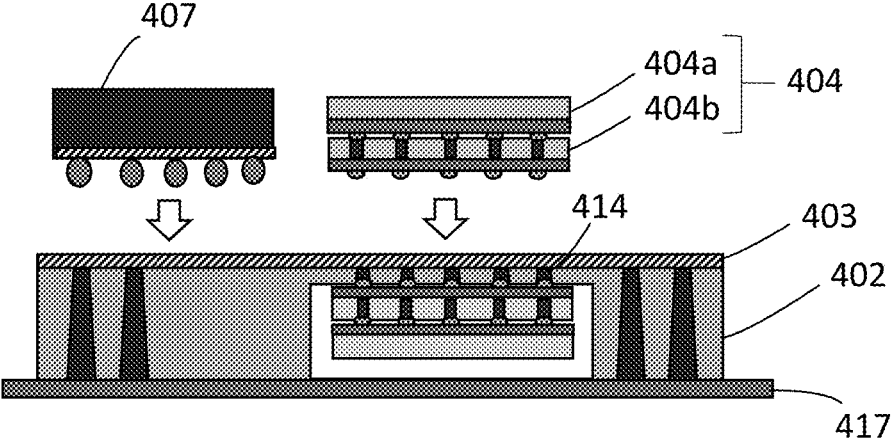

In FIG. 4E, according to a further aspect in forming the semiconductor package 400, the interposer 402 with the redistribution layer 403 may be removed from the first carrier 415 and inverted and attached to a second carrier 417. This is followed by a top-side stacked memory device 404 (i.e., memory devices 404a and 404b), and a processor device 407 is positioned and attached to the redistribution layer 403 using conventional methods, including solder bonding, thermal compression bonding, or other surface mounting methods.

Figure 4F:
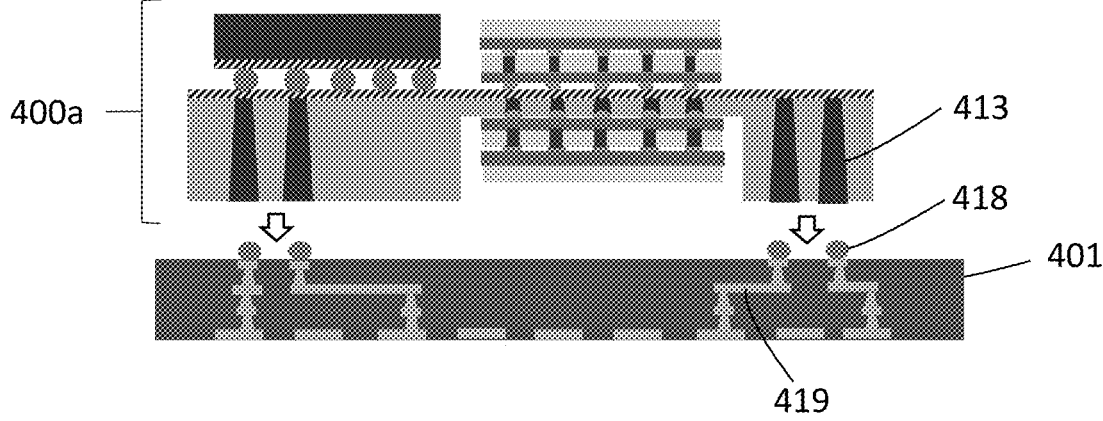

In FIG. 4F, according to a further aspect in forming the semiconductor package 400, a subassembly 400a may be removed from the second carrier 417 (not shown) and the interposer TSVs 413 may be aligned and coupled to solder bumps 418 positioned on interconnects 419 in a package substrate 401 by a conventional solder reflow process step.

Figure 4G:
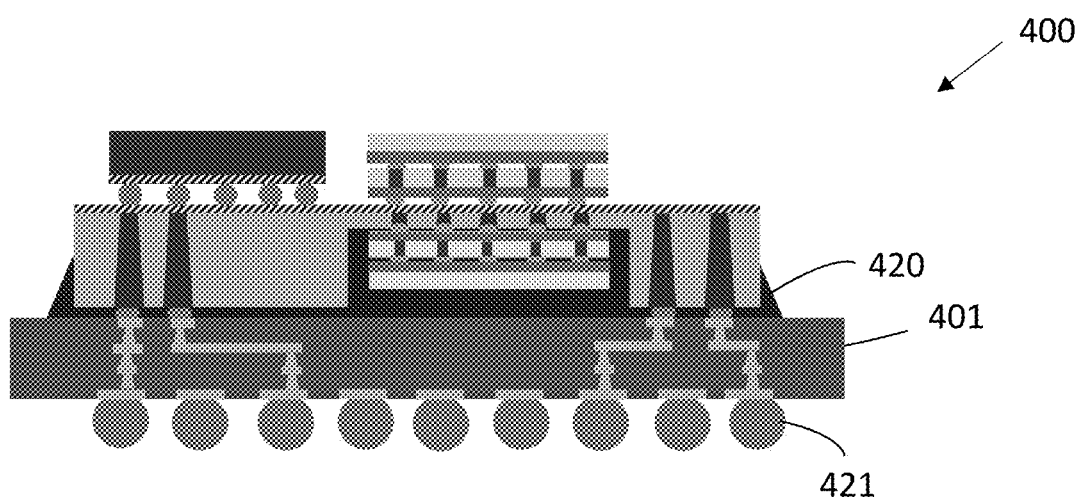

In FIG. 4G, according to a further aspect in forming the semiconductor package 400, an underfill material 420 may be provided by a conventional capillary process to stabilize the semiconductor package, and a plurality of solder balls 421 may be attached to package substrate 401 by a conventional solder reflow process for subsequent attachment to a printed circuit board (not shown).

FIG. 5 shows a simplified flow diagram for an exemplary method for making semiconductor packages with stacked memory devices according to an aspect of the present disclosure.

The operation 501 may be directed to providing an interposer having a redistribution layer (RDL) at a top surface and forming a recess in a bottom surface of the interposer.

The operation 502 may be directed to forming a plurality of through silicon vias in the interposer, including in the recess, coupled to the RDL.

The operation 503 may be directed to placing at least one recess stacked memory device in the recess for coupling to the RDL.

The operation 504 may be directed to positioning a top-side stacked memory device over a top surface of the interposer for coupling to the RDL.

The operation 505 may be directed to aligning a footprint of the top-side stacked memory device to at least partially overlap with the recess stacked memory device in the recess when positioning the top-side stacked memory device.

The operation 506 may be directed to coupling a processor device to the RDL on the top surface of the interposer.

The fabrication methods and the choice of materials presented above are intended to be exemplary for forming the present semiconductor packages. It will be apparent to those ordinary skilled practitioners that the foregoing process operations may be modified without departing from the spirit of the present disclosure.

Figure 6:
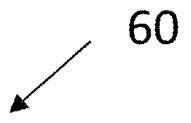
FIG. 6 shows an illustration of a computing device that includes a present semiconductor package according to a further aspect of the present disclosure.

Aspects of the present disclosure may be implemented into a system using any suitable hardware and/or software. FIG. 6 schematically illustrates a computing device 60 that may include a semiconductor package as described herein, in accordance with some aspects, for which a present computer device may include a printed circuit board, a semiconductor package that may have a package substrate, an interposer with a top surface and a bottom surface positioned over and coupled to a top surface of the package substrate, and a redistribution layer positioned on the top surface of the interposer. In addition, a first recess may be formed in the bottom surface in the interposer and a plurality of through silicon vias may be formed in the interposer, including the recess, that are coupled to the redistribution layer. Furthermore, a first recess device may be positioned in the first recess and coupled to the redistribution layer, and a first top-side device may be positioned on and coupled to a top surface of the redistribution layer, and a footprint of the first top-side device may be aligned to at least partially overlap the first recess device.

In another aspect, the computing device 60 may house a board such as a motherboard 601. The motherboard 601 may include a number of components, including, but not limited to, a semiconductor package 600 and at least one communication chip 602. The semiconductor package according to the present disclosure, may be physically and electrically coupled to the motherboard 601. In some implementations, the at least one communication chip 602 may also be physically and electrically coupled to the motherboard 601. In further implementations, the communication chip 602 may be part of a semiconductor package.

Depending on its applications, computing device 60 may include other components that may or may not be physically and electrically coupled to the motherboard 601. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 600 of the computing device 60 may include a recessed memory device, as described herein.

The communication chip 602 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 602 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 602 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 602 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 602 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 602 may operate in accordance with other wireless protocols in other aspects.

The computing device 60 may include a plurality of communication chips 602. For instance, a first communication chip 602 may be dedicated to shorter range wireless communications such as Wi-Fi and Bluetooth and a second communication chip 602 may be dedicated to longer range wireless communications such as GPS, EDGE, GPRS, CDMA, WiMAX, LTE, Ev-DO, and others.

In various implementations, the computing device 60 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 60 may be a mobile computing device. In further implementations, the computing device 60 may be any other electronic device that processes data.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

To more readily understand and put into practical effect the present measurement tool and methods, particular aspects will now be described by way of examples. For the sake of brevity, duplicate descriptions of features and properties may be omitted.

Examples

Example 1 provides a semiconductor package substrate including a package substrate, an interposer with a top surface and a bottom surface positioned over and coupled to a top surface of the package substrate, a redistribution layer with a top surface and a bottom surface positioned on the top surface of the interposer, a plurality of through silicon vias formed in the interposer coupled to the redistribution layer, a first recess formed in the bottom surface in the interposer, a first recess device positioned in the first recess and coupled to the bottom surface of the redistribution layer, and a first top-side device positioned on and coupled to the top surface of the redistribution layer, for which a footprint of the first top-side device overlaps the first recess device.

Example 2 may include the semiconductor package of example 1 and/or any other example disclosed herein, for which the plurality of through silicon vias further includes at least one first recess through silicon via coupling the first recess device to the redistribution layer.

Example 3 may include the semiconductor package of example 1 and/or any other example disclosed herein, further including a first processor device positioned over and coupled to the redistribution layer, for which a footprint of the first processor device overlaps the first recess device.

Example 4 may include the semiconductor package of example 2 and/or any other example disclosed herein, for which the first recess device includes first recess stacked memory devices, and the first top-side device includes first top-side stacked memory devices.

Example 5 may include the semiconductor package of example 4 and/or any other example disclosed herein, for which the first recess further includes an upper first recess section and a lower first recess section with first and second recess steps, for which the lower first recess section is greater in size (e.g., wider and/or longer) than the upper first recess section.

Example 6 may include the semiconductor package of example 5 and/or any other example disclosed herein, for which the first recess stacked memory devices further includes a first upper recess device positioned in the upper first recess section, and a first lower recess device in the lower first recess section being positioned on the first recess step, and a second lower recess device in the lower first recess section being positioned on the second recess step.

Example 7 may include the semiconductor package of example 6 and/or any other example disclosed herein, for which the plurality of through silicon vias further includes recess step through silicon vias formed in the first and second recess steps of the lower first recess section coupling the first and second lower recess devices to the redistribution layer.

Example 8 may include the semiconductor package of example 7 and/or any other example disclosed herein, further including a second recess formed in the bottom surface in the interposer forming a second recess, a second recess device positioned in the second recess and coupled to the redistribution layer, and a second top-side device positioned over and coupled to the redistribution layer, for which a footprint of the second top-side device overlaps the second recess device.

Example 9 may include the semiconductor package of example 8 and/or any other example disclosed herein, further including the second recess being contiguous with the first recess.

Example 10 may include the semiconductor package of example 8 and/or any other example disclosed herein, for which the plurality of through silicon vias further includes at least one second recess through silicon via coupling the second recess device to the redistribution layer.

Example 11 may include the semiconductor package of example 8 and/or any other example disclosed herein, further including a second processor device positioned over and coupled to the redistribution layer, for which a footprint of the second processor device overlaps the second recess device.

Example 12 may include the semiconductor package of example 10 and/or any other example disclosed herein, for which the second recess device includes first recess stacked memory devices, and the second top-side device includes first top-side stacked memory devices.

Example 13 may include the semiconductor package of example 12 and/or any other example disclosed herein, for which the second recess device includes first recess stacked memory devices, and the second top-side device includes first top-side stacked memory devices.

Example 14 may include the semiconductor package of example 13 and/or any other example disclosed herein, for which the second recess stacked memory devices further includes a first upper recess device positioned in the upper second recess section, and a first lower recess device in the lower second recess section being positioned on the first recess step, and a second lower recess device in the lower second recess section being positioned on the second recess step.

Example 15 may include the semiconductor package of example 14 and/or any other example disclosed herein, for which the plurality of through silicon vias further includes recess step through silicon vias formed in the first and second recess steps of the lower second recess section coupling the first and second lower recess devices to the redistribution layer.

Example 16 provides a method including providing an interposer with a top and bottom surface, forming a first recess in the bottom surface of the interposer, forming a plurality of through silicon vias in the interposer, for which the forming the plurality of through silicon vias comprise at least one first recess through silicon via formed in the at least one first recess, positioning a first recess device in the first recess, and positioning a first top-side device over the top surface of the interposer, for which the first top-side device having a footprint aligned to at least partially overlap with the first recess device.

Example 17 may include the method of example 16 and/or any other example disclosed herein, further including forming a second recess in the bottom surface of the interposer, positioning a second recess device in the second recess, and positioning a second top-side device over the top surface of the interposer, for which the second top-side device having a footprint aligned to at least partially overlap with the second recess device.

Example 18 may include the method of example 16 and/or any other example disclosed herein, for which forming the first recess further includes forming a first recess step in a first sidewall of the first recess and a second recess step in an opposing second sidewall of the first recess, for which the first and second recess steps form an upper first recess section and a lower first recess section, and for which the lower first recess section is greater in size than the upper first recess section, for which forming the plurality of through silicon vias further includes recess step through-silicon vias being formed in the first and second recess steps of the lower first recess section coupling the first and second lower recess devices to the redistribution layer, and for which positioning the first recess device includes positioning a first upper recess device positioned in the upper first recess section, a first lower recess device in the lower first recess section being positioned on the first recess step, and a second lower recess device in the lower first recess section being positioned on the second recess step.

Example 19 provides a computing device including a printed circuit board and a semiconductor package, the semiconductor package including a package substrate and an interposer with a top surface and a bottom surface positioned over and coupled to a top surface of the package substrate, a redistribution layer with a top surface and a bottom surface positioned over the top surface of the interposer, a plurality of through silicon vias formed in the interposer coupled to the redistribution layer and a recess formed in the bottom surface in the interposer, a first recess memory device positioned in the first recess and coupled to the bottom surface of the redistribution layer and a first top-side memory device positioned on and coupled to the top surface of the redistribution layer, for which a footprint of the first top-side device overlaps the first recess device, and a processor device positioned on the interposer and coupled to the top surface of the redistribution layer.

Example 20 may include the computing device of example 19 and/or any other example disclosed herein, for which the semiconductor package further includes a second recess memory device positioned in a second recess and coupled to the bottom surface of the redistribution layer, a second top-side memory device positioned on and coupled to the top surface of the redistribution layer, for which a footprint of the top-side device overlaps the second recess device, and a second processor device positioned on the interposer and coupled to the top surface of the redistribution layer.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate;
an interposer with a top surface and a bottom surface positioned over and coupled to a top surface of the package substrate;
a redistribution layer with a top surface and a bottom surface positioned on the top surface of the interposer;
a first recess formed in the bottom surface of the interposer;
a plurality of through silicon vias formed in the interposer coupled to the redistribution layer, wherein the plurality of through silicon vias further comprises at least one first recess through silicon via in a top recessed surface of the first recess;
a first recess device positioned in the first recess and coupled to the bottom surface of the redistribution layer,
wherein the first recess comprises an upper first recess section and a lower first recess section with first and second recess steps,
wherein the lower first recess section is disposed at a lower level and is greater in width than the upper first recess section, and wherein the first recess device comprises at least two first recess stacked memory devices disposed partially upon the first and second recess steps and partially upon the first recess device;
a plurality of solder bumps on the first recess device, wherein the plurality of solder bumps is adjacent to and coupled to the at least one first recess through silicon via coupling the first recess device to the bottom surface of the redistribution layer; and
a first top-side device positioned on and coupled to the top surface of the redistribution layer, wherein a footprint of the first top-side device overlaps the first recess device.

2. The semiconductor package of claim 1, further comprising a first processor device positioned over and coupled to the redistribution layer, wherein a footprint of the first processor device overlaps the first recess device.

3. The semiconductor package of claim 1, wherein the first recess stacked memory devices further comprises:
a first upper recess device positioned in the upper first recess section;
a first lower recess device in the lower first recess section being positioned on the first recess step; and
a second lower recess device in the lower first recess section being positioned on the second recess step.

4. The semiconductor package of claim 3, wherein the plurality of through silicon vias further comprises:
recess step through-silicon vias formed in the first and second recess steps of the lower first recess section coupling the first and second lower recess devices to the redistribution layer.

5. The semiconductor package of claim 4, further comprising:
a second recess formed in the bottom surface in the interposer forming a second recess;
a second recess device positioned in the second recess and coupled to the redistribution layer; and
a second top-side device positioned over and coupled to the redistribution layer, wherein a footprint of the second top-side device overlaps the second recess device.

6. The semiconductor package of claim 5, further comprising the second recess being contiguous with the first recess.

7. The semiconductor package of claim 5, wherein the plurality of through silicon vias further comprises at least one second recess through silicon via coupling the second recess device to the redistribution layer.

8. The semiconductor package of claim 5, further comprising a second processor device positioned over and coupled to the redistribution layer, wherein a footprint of the second processor device overlaps the second recess device.

9. The semiconductor package of claim 7, wherein the second recess device comprises first recess stacked memory devices, and the second top-side device comprises first top-side stacked memory devices.

10. The semiconductor package of claim 9, wherein the second recess further comprises an upper second recess section and a lower second recess section with first and second recess steps, wherein the lower second recess section is greater in size than the upper second recess section.

11. The semiconductor package of claim 10, wherein the second recess stacked memory devices further comprises:
a first upper recess device positioned in the upper second recess section;
a first lower recess device in the lower second recess section being positioned on the first recess step; and a second lower recess device in the lower second recess section being positioned on the second recess step.

12. The semiconductor package of claim 11, wherein the plurality of through silicon vias further comprises:

recess step through-silicon vias formed in the first and second recess steps of the lower second recess section coupling the first and second lower recess devices to the redistribution layer.

13. A method comprising:

positioning an interposer with a top surface and a bottom surface over a top surface of a package substrate and coupling the interposer to the top surface of the package substrate;

positioning a redistribution layer with a top surface and a bottom surface on the top surface of the interposer;

forming a first recess in the bottom surface of the interposer, wherein the first recess comprises an upper first recess section and a lower first recess section with first and second recess steps, and wherein the lower first recess section is disposed at a lower level and is greater in width than the upper first recess section;

forming a plurality of through silicon vias in the interposer, wherein the forming the plurality of through silicon vias comprises forming at least one first recess through silicon via in a top recessed surface of the first recess, wherein the first recess device comprises at least two first recess stacked memory devices disposed partially upon the first and second recess steps and partially upon the first recess device;

forming a plurality of solder bumps on a first recess device, wherein the plurality of solder bumps is adjacent to the at least one first recess through silicon via;

positioning the first recess device in the first recess and coupling the plurality of solder bumps on the first recess device to the at least one first recess through silicon via to couple the first recess device to the bottom surface of the redistribution layer; and positioning a first top-side device over the top surface of the redistribution layer and coupling the first top-side device to the top surface of the redistribution layer, wherein the first top-side device having a footprint aligned to at least partially overlap with the first recess device.

14. The method of claim 13, further comprising:

forming a second recess in the bottom surface of the interposer;

positioning a second recess device in the second recess; and positioning a second top-side device over the top surface of the interposer, the second top-side device having a footprint aligned to at least partially overlap with the second recess device.

15. The method of claim 13, wherein forming the first recess further comprises:

forming a first recess step in a first sidewall of the first recess and a second recess step in an opposing second sidewall of the first recess, wherein the first and second recess steps form an upper first recess section and a lower first recess section, and wherein the lower first recess section is greater in size than the upper first recess section, wherein forming the plurality of through silicon vias further comprises recess step through silicon vias being formed in the first and second recess steps of the lower first recess section coupling the first and second lower recess devices to the redistribution layer, and wherein positioning the first recess device comprises positioning a first upper recess device positioned in the upper first recess section, a first lower recess device in the lower first recess section being positioned on the first recess step, and a second lower recess device in the lower first recess section being positioned on the second step.

16. A computing device comprising:

a printed circuit board and a semiconductor package, the semiconductor package comprising:

a package substrate and an interposer with a top surface and a bottom surface positioned over and coupled to a top surface of the package substrate;

a redistribution layer with a top surface and a bottom surface positioned over the top surface of the interposer;

a first recess formed in the bottom surface of the interposer;

a plurality of through silicon vias formed in the interposer coupled to the redistribution layer, wherein the plurality of through silicon vias further comprises at least one first recess through silicon via in a top recessed surface of the first recess;

a first recess memory device positioned in the first recess and coupled to the bottom surface of the redistribution layer and a first top-side memory device positioned on and coupled to the top surface of the redistribution layer, wherein a footprint of the first top-side device overlaps the first recess device, wherein the first recess comprises an upper first recess section and a lower first recess section with first and second recess steps, wherein the lower first recess section is disposed at a lower level and is greater in width than the upper first recess section, and wherein the first recess device comprises at least two first recess stacked memory devices disposed partially upon the first and second recess steps and partially upon the first recess device;

a plurality of solder bumps on the first recess memory device, wherein the plurality of solder bumps is adjacent to and coupled to the at least one first recess through silicon via coupling the first recess memory device to the bottom surface of the redistribution layer; and a processor device positioned on the interposer and coupled to the top surface of the redistribution layer.

17. The computing device of claim 16, wherein the semiconductor package further comprises:

a second recess memory device positioned in a second recess and coupled to the bottom surface of the redistribution layer;

a second top-side memory device positioned on and coupled to the top surface of the redistribution layer, wherein a footprint of the top-side device overlaps the second recess device; and a second processor device positioned on the interposer and coupled to the top surface of the redistribution layer.

* * * * *